(12) United States Patent
Miyamae et al.

(10) Patent No.: US 7,625,136 B2
(45) Date of Patent: Dec. 1, 2009

(54) OPTICAL MODULE AND OPTICAL COMMUNICATION DEVICE

(75) Inventors: Akira Miyamae, Fujimi-machi (JP); Kimio Nagasaka, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 76 days.

(21) Appl. No.: 11/955,893

(22) Filed: Dec. 13, 2007

(65) Prior Publication Data

US 2008/0144679 A1    Jun. 19, 2008

(30) Foreign Application Priority Data

Dec. 18, 2006    (JP)    ............... 2006-339776

(51) Int. Cl.
  *G02B 6/36* (2006.01)
  *G02F 1/295* (2006.01)

(52) U.S. Cl. .................. 385/92; 385/4; 385/5; 385/88; 385/93; 385/94

(58) Field of Classification Search ............... 385/93, 385/4, 5, 88, 92, 94
  See application file for complete search history.

(56) References Cited

U.S. PATENT DOCUMENTS 7,410,305 B2 *   8/2008   Ohe et al. ............... 385/88
7,439,533 B2 *  10/2008   Kito et al. .............. 250/552

FOREIGN PATENT DOCUMENTS

| JP | A 08-236807 | 9/1996 |
| JP | A 10-65189  | 3/1998 |
| JP | A 2004-72072 | 3/2004 |

\* cited by examiner

*Primary Examiner*—Ryan Lepisto
(74) *Attorney, Agent, or Firm*—Oliff & Berridge, PLC

(57) ABSTRACT

An optical module includes a light source, a variable transmittance member disposed on a light path of output light from the light source distant from the light source, and a coupling section for coupling the output light from the light source via the variable transmittance member, wherein coupling efficiency as a ratio between intensity of the light from the light source and intensity of light to be coupled to the coupling section rises in conjunction with a rise in temperature.

14 Claims, 12 Drawing Sheets

|  | REFRACTIVE INDEX (25°C) | TEMPERATURE COEFFICIENT OF REFRACTIVE INDEX |
|---|---|---|
| PEI | 1.64 | $-1.91 \times 10^{-4}$ |
| PMMA | 1.49 | $-1.10 \times 10^{-4}$ |
| PC | 1.59 | $-1.20 \times 10^{-4}$ |
| PS | 1.59 | $-1.10 \times 10^{-4}$ |

OPTICAL MODULE AND OPTICAL COMMUNICATION DEVICE

The entire disclosure of Japanese Patent Application No. 2006-339776, filed Dec. 18, 2006 is expressly incorporated by reference herein.

BACKGROUND OF THE INVENTION

1. Technical Field

The present invention relates to an optical module used for optical communications and an optical communication device.

2. Related Art

Optical modules have various forms, and there is known, as one of the forms, an optical module having a structure for receiving a part of the light output from a light emitting element by a monitoring light receiving element to monitor the intensity of the light. In this case, an intensity variation in the output light caused by ambient temperature may sometimes occur. Therefore, in the past, the temperature characteristic of each of the members such as a monitoring light receiving element or a lens has been set as low as possible to maintain a proportional relationship between the monitor light intensity and the fiber coupling light intensity independently of the ambient temperature (see, e.g., JP-A-2004-72072 and JP-A-10-65189).

Further, JP-A-8-236807 discloses a technology for reducing the variation in the optical output caused by the temperature by using a multilayer transmission film (27) having low transmittance to the emission wavelength providing the light emitted from the light emitting layer (24) with high emission intensity.

The inventors have considered making the emission intensity of the light emitting element constant by performing feedback control of a drive current of the light emitting element in accordance with the emission intensity of the optical module. In particular, in the case of using a vertical cavity surface emitting laser (VCSEL) is used as the light emission element, since a large intensity variation is caused by the ambient temperature, which causes a phenomenon that the higher the temperature rises, the lower the emission intensity becomes, feedback control (auto power control (APC)) for controlling the drive current so that the higher the ambient temperature becomes, the lager drive current is applied becomes important for keeping the intensity constant.

On the other hand, in an optical module in 850 nm band or higher, the drive current needs to be larger in order for operating at high speed even at low temperature. This is because there is caused a phenomenon that the operation band of the element is lowered when the drive current becomes small at low temperature. In this case, since the optical output becomes large, the light intensity is attenuated (attenuation) using a partial reflection film, thereby achieving safely of human eyes.

However, if the feedback control of the drive current of the light emitting element is performed based on the attenuated light intensity, the drive current is further increased at high temperature. As a result, in some cases, the drive current exceeds a limit value (an upper limit value), which causes a problem that a proper operation becomes difficult at a certain temperature or higher because of an insufficient output. On the contrary, when operating it with a constant drive current, although the use temperature range is widened, the intensity variation becomes large, as described above.

Further, regarding a laser beam, there is an amount of current with which the laser beam is emitted most efficiently at each temperature, and if driving with such an amount of current is possible, the use temperature range can be widened, and further the transmission characteristics can be improved (e.g., achieving higher-speed, lower-noise operation).

SUMMARY

Therefore, an advantage of the invention is to reduce the temperature-dependent variation in the output light of an optical module. Further, it is also an advantage to widen an operable temperature range of an optical module. Still further, it is also an advantage to improve the characteristic of an optical module.

According to a first aspect of the invention, there is provided an optical module including a light source, a variable transmittance member disposed on a light path of output light from the light source distant from the light source, and a coupling section for coupling the output light from the light source via the variable transmittance member, wherein coupling efficiency as a ratio between intensity of the light from the light source and intensity of light to be coupled to the coupling section rises in conjunction with a rise in temperature.

According to such a configuration, the decrease in the output light in accordance with temperature can be compensated with a rise in the coupling efficiency.

Preferably, the variable transmittance member has transmittance rising in conjunction with rise in temperature. According to such a configuration, the variation in the output light corresponding to temperature can be reduced.

Specifically, the light source is a vertical cavity surface emitting laser. According to such a configuration, even in the case of using the laser with a large variation in the light intensity corresponding to temperature, the variation in the output light corresponding to temperature can be reduced.

Preferably, the variable transmittance member is a diffraction grating having transmission efficiency varying in accordance with temperature. According to such a configuration, the coupling efficiency of the output light in the coupling section can easily be raised in conjunction with rise in temperature.

Preferably, the diffraction grating includes two members with temperature-dependent variations in refractive index different from each other. According to such a configuration, the transmission efficiency can easily be adjusted.

Specifically, the diffraction grating includes an organic material with refractive index lowered in conjunction with a rise in temperature and an inorganic material. According to such a configuration, the transmission efficiency can easily be adjusted.

Specifically, the diffraction grating includes a first layer made of glass and provided with a convexo-concave pattern on one surface of the first layer, and a second layer made of the organic material formed on the convexo-concave pattern. As described above, by using the glass with a little variation in refractive index, adjustment of the transmission efficiency becomes easy.

Specifically, the diffraction grating includes a first layer made of glass and provided with a convexo-concave pattern on a first surface of the first layer, and a second layer made of the organic material and for bonding the first surface to a transmitting member positioned on the light path. According to such a configuration, the adjustment of the transmission efficiency can be achieved by the adhesive.

Specifically, the diffraction grating includes an organic material with refractive index lowered in conjunction with rise in temperature and an inorganic material, the organic material having higher refractive index than the inorganic material, and the zero-order light of the diffraction grating is coupled in the coupling section. According to such a configuration, by using the zero-order light, the coupling efficiency of the output light can be improved.

Specifically, the diffraction grating includes an organic material with refractive index lowered in conjunction with rise in temperature and an inorganic material, the organic material having lower refractive index than the inorganic material, and the first-order light of the diffraction grating is coupled in the coupling section. According to such a configuration, by using the first-order light, the intensity of the optical output can be adjusted, and for example, a reflection member for attenuation can be eliminated.

Specifically, the diffraction grating is a one-dimensional diffraction grating. According to such a configuration, the diffraction grating can be configured with a simple pattern.

Specifically, the diffraction grating is a two-dimensional diffraction grating. According to such a configuration, the depth of the convexo-concave pattern for diffraction can be reduced. Further, as a pattern of such a diffraction grating, a checkerboard pattern can be used.

The variable transmittance member is disposed a first distance distant from the light source, and the optical module is further provided with a partial reflection member disposed on the light path a second distance greater than the first distance distant from the light source, and for reflecting a first light out of light transmitted through the variable transmittance member and transmitting a second light out of the transmitted light, and a light intensity monitor disposed on a light path of the first light, wherein the light intensity monitor detects light intensity of the first light transmitted through the variable transmittance member.

According to such a configuration, the light intensity variation of the output light corresponding to temperature can also be reduced by the light intensity monitor. Therefore, the use temperature range of the optical module can be widened.

According to a second aspect of the invention, there is provided an optical communication device provided with the optical module described above. According to such a configuration, the performance of the optical communication device can be improved.

BRIEF DESCRIPTION OF THE DRAWINGS

The invention will now be described with reference to the accompanying drawings, wherein like numbers refer to like elements.

DESCRIPTION OF THE EMBODIMENTS

Figure 1:
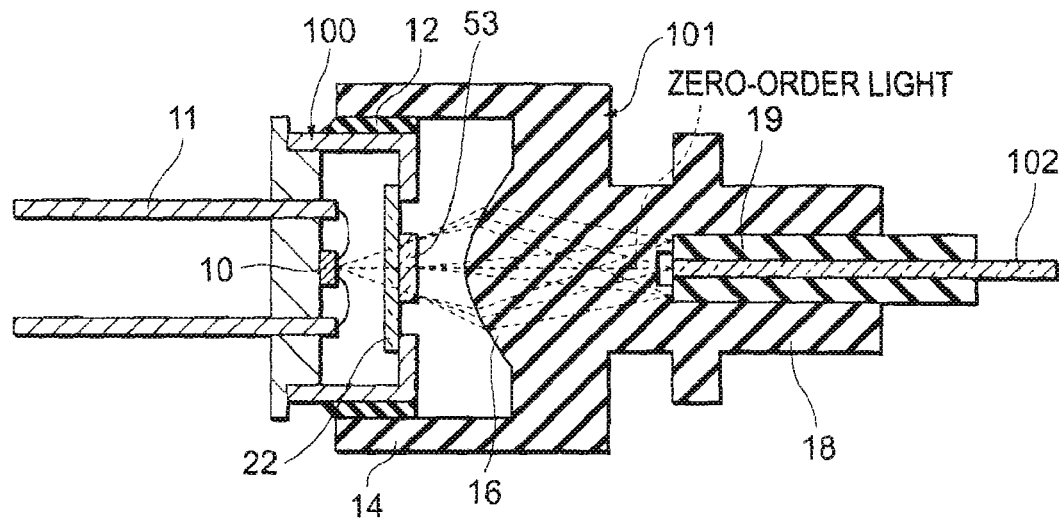
FIG. 1 is a cross-sectional view showing a configuration of an optical module according to a first embodiment of the invention.

An embodiment of the invention will hereinafter be described in detail with reference to the accompanying drawings. It should be noted that those having the same function are denoted with the same reference numeral or relevant reference numerals, and a redundant explanation therefor will be omitted.

First Embodiment

FIG. 1 is a cross-sectional view showing a configuration of an optical module (e.g., an optical transmission module, an optical transmission device, a light emitting module, or an optical transmitter) according to the present embodiment. The optical module of the present embodiment is configured by aligning a can package (CAN) 100 and a connector component 101 with each other, and then fixing the both using an adhesive 12. The connector component 101 supports an end of an optical fiber 102 to optically couple the optical fiber 102 with a light emitting element (light source) 10 inside the can package 100.

The can package 100 is configured by packaging the light emitting element (a chip) 10 with a housing made, for example, of metal. In the present embodiment, a vertical cavity surface emitting laser diode (VCSEL) performing multimode emission is used as the light emitting element 10. The wavelength of the output light of the light emitting element 10 is, for example, 850 nm. The light emitting element 10 is connected to lead wires 11 via wires or the like. The light emitting element 10 is driven via the lead wires 11. Further, the can package 100 is provided with a glass plate (a transmitting member) 22 disposed distant from the light emitting element 10. The glass plate 22 is disposed between the light emitting element 10 and a lens 16, namely on a light path (the optical axis) of the output light of the light emitting element 10. Here, it is disposed so as to have one surface (an obverse side) thereof perpendicular to the optical axis.

The connector component 101 is provided with a support section 14 having a hole like shape and for supporting the can package 100, the lens 16, and a sleeve section 18 for supporting one end of the optical fiber 102 mounted therein. The lens 16 is disposed on the light path of the output light of the light emitting element 10, and collects the output light of the light emitting element 10 to lead it to the one end of the optical fiber 102. These regions are formed integrally by, for example, resin processing. Obviously, the connector component 101 can be formed by bonding each of these regions formed as separate members.

Further, the one end of the optical fiber 102 is provided with a ferrule 19 mounted thereto, and the ferrule is inserted in the sleeve section 18. This optical fiber 102 is a graded index (GI) multimode fiber with, for example, a core diameter of 50 μm, a clad diameter of 125 μm, and an NA of 0.21.

It should be noted here that the present embodiment is characterized in disposing the diffraction grating 53 on the reverse side (the side opposite to the side of the light emitting element 10) of the glass plate 22. The diffraction grating 53 is a variable transmittance member disposed distant from the light emitting element 10. Further, the diffraction grating 53 is arranged so that the transmission efficiency varies in accordance with the temperature to raise the coupling efficiency in conjunction with rise in the temperature. Specifically, it is composed of two members with different temperature-dependent variations in refractive index (n) so that the transmission efficiency rises in conjunction with the rise in the temperature. Here, "coupling efficiency" denotes a ratio between the intensity of the light from the light emitting element and the intensity of the light coupled to the end of the optical fiber. It should be noted that although the end of the optical fiber is shown here as the coupling section, a certain region on the light path on the output side of the diffraction grating 53 can be regarded as the coupling section to take the light intensity in that region as the reference.

Figure 2:
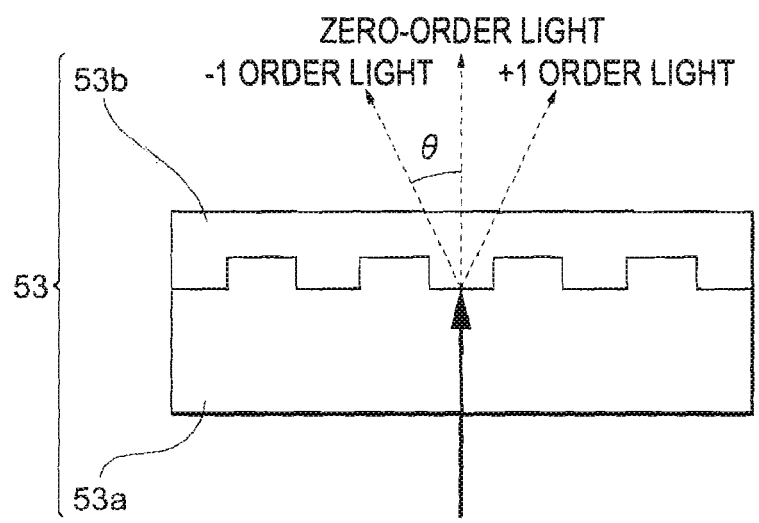
FIG. 2 is a cross-sectional configuration diagram showing an example of a diffraction grating.
Figure 3:
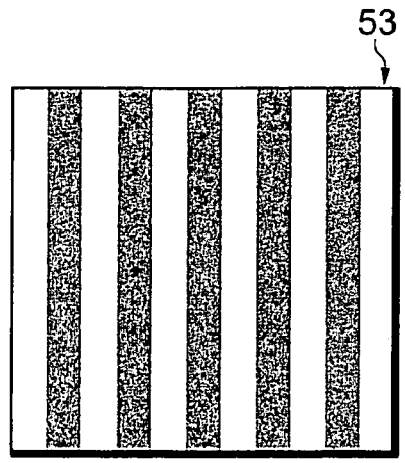
FIG. 3 is a schematic diagram showing an example of a grating pattern.

FIG. 2 shows an example of a cross-sectional configuration diagram of the diffraction grating. The diffraction grating 53 is composed of a first layer 53a made of an inorganic material such as glass and a second layer 53b made of resin (an organic material). On the surface (a first surface) of the first layer 53a is provided with a convexo-concave pattern (a grating pattern) for causing the diffraction, and the second layer 53b is formed on the convexo-concave pattern. FIG. 3 shows an example of the grating pattern. Here, the grating pattern having a striped (substantially rectangular, striping, stripe-patterned) shape as shown in FIG. 3 is adopted. The diffraction grating with such a grating pattern is called a simple diffraction grating (a one-dimensional diffraction grating). The gray sections in the drawing correspond to concave sections.

The light passing through the diffraction grating is branched into zero-order light, ±1 order light, ±2 order light, and so on. In the case with the simple grating with a substantially rectangular shape, almost all of the transmitted light becomes the zero-order light or the ±1 order light. Here, as shown in FIG. 1, the zero-order light is coupled to the end section (the coupling section or the light receiving section) of the optical fiber 102. As described above, by using the zero-order light, the efficiency of the output light intensity of the light emitting element becomes high. It should be noted that the ±1 order light is blocked to be terminated by the ferrule 19 covering the optical fiber 102, but is not received by the optical fiber 102.

Here, the transmission efficiency of the zero-order light is set lower to some extent so as to exert an attenuation effect. Therefore, a partial reflection film, which is necessary in the related art, can be eliminated. Further, in the case in which the amount of attenuation is small, it is possible to use the partial reflection film together therewith to increase the amount of attenuation.

An example of a method of manufacturing such a diffraction grating will now be explained. For example, a film to be a mask is formed on the glass (a first layer) as lines corresponding to the white sections in FIG. 3 using a photolithography technology. Subsequently, by etching the glass by an etching method using the mask film described above as the mask, the concave sections (the gray pattern in the drawing) is formed. Then, the mask film is removed by etching.

Subsequently, polyetherimide (PEI) resin as an example of the resin (an organic material, a second layer) is melted at high temperature to be applied on a process surface (the obverse side, the surface with the convexo-concave pattern), and then cooled to be cured. According to the above process, the diffraction grating is formed. The PEI resin is a thermoplastic resin. As described above, by using the thermoplastic resin, the diffraction grating can easily be formed. For example, the reverse side of the glass of the diffraction grating is bonded with the glass plate 22. It should be noted that it is possible to bond the glass plate 22 with the glass on the side of the resin 53b. Further, although in FIG. 1, the diffraction grating 53 is disposed outside (the output side of the can package 100) the glass plate 22, the diffraction grating 53 can also be disposed inside the glass plate 22. Further, it can be disposed so that the grating pattern forms a vertically-striped pattern, or disposed so that the grating pattern forms a horizontally-striped pattern.

Still further, the PEI resin has a characteristic that the refractive index thereof is lowered in conjunction with rise in the temperature. In other words, the resin has a negative variation coefficient of the refractive index to the temperature. Specifically, the refractive index of the PEI resin at 25° C. is 1.64, and the temperature coefficient of the refractive index is $-1.91 \times 10^{-4}$. That is, the refractive index is lowered by $1.91 \times 10^{-4}$ every rise in temperature of 1° C. On the other hand, the refractive index of the glass used here at 25° C. is 1.58 with little (negligible small) temperature-dependent variation in the refractive index. Further, it is arranged here that the refractive index of the glass keeps smaller than the refractive index of the resin in a use temperature range (e.g., −20° C. through 80° C.). For example, the refractive indexes at 25° C. are set as 1.58<1.64. Therefore, at the high temperature, the refractive index of the resin is lowered, thus reducing the difference in the refractive index.

Here, the transmission efficiency of the zero-order light of the diffraction grating 53 is determined by a difference in the refractive index between the glass (the first layer) 53a and the resin (the second layer) 53b. Therefore, the difference in the refractive index becomes large at low temperature or small at high temperature. Consequently, the zero-order light passes more easily at high temperature. In other words, the transmission efficiency of the zero-order light passing through the diffraction grating becomes low at low temperature or high at high temperature. As a result, the decrease in the output of the light emitting element 10 can be compensated.

As described above, in the present embodiment, since the diffraction grating is disposed on the light path of the output light from the light emitting element 10, the temperature-dependent variation of the output light (the light transmitted through the diffraction grating 53) of the can package 100 can be reduced.

Figure 4:
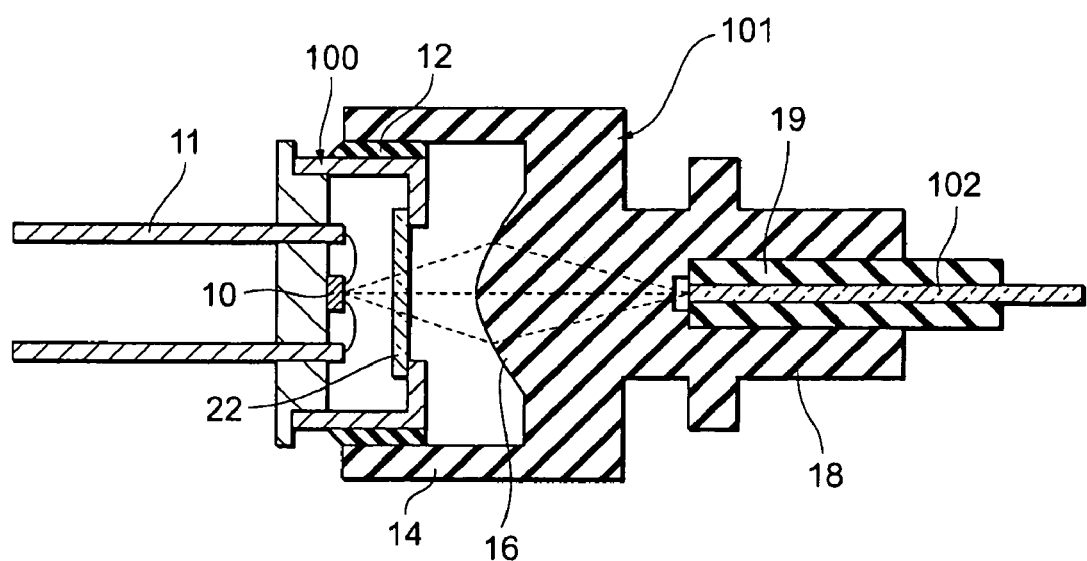
FIG. 4 is a cross-sectional view showing a configuration of an optical module (a comparative example 1) in the case of not using a diffraction grating 53.
Figure 5:
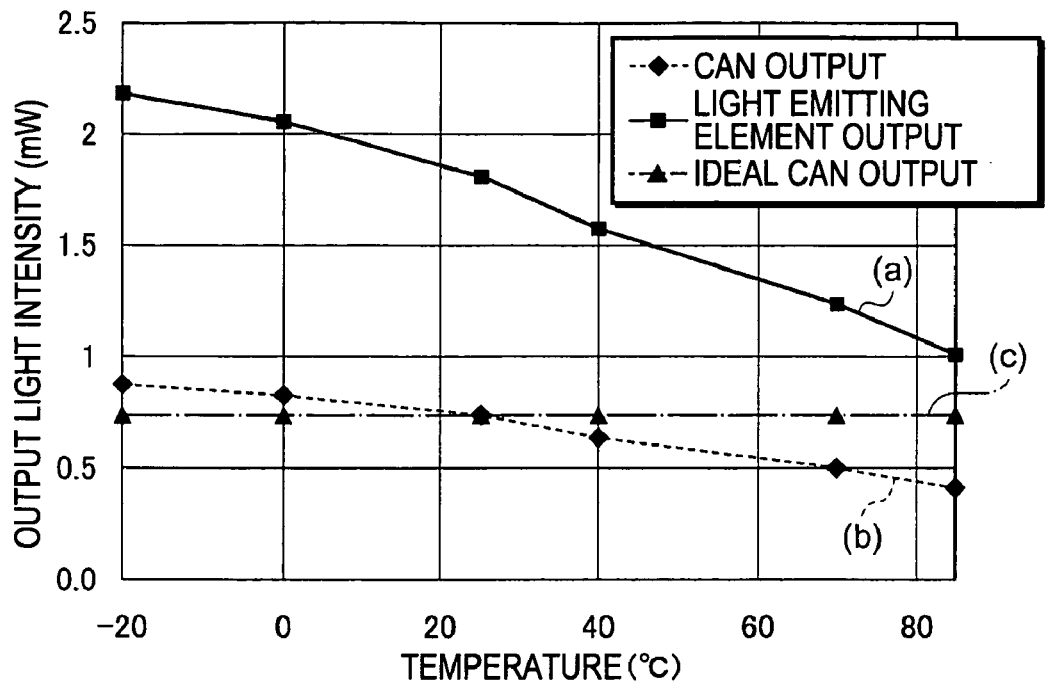
FIG. 5 is a diagram (a graph) showing a temperature characteristic of output light intensity of each of a light emitting element and a can package shown in FIG. 4.

Hereinafter, the advantages will be explained further in detail with reference to FIGS. 4 through 8. FIG. 4 is a cross-sectional view showing a configuration of an optical module (a comparative example 1) in the case of not using a diffraction grating 53. FIG. 5 is a diagram showing a temperature characteristic of output light intensity of each of a light emitting element and a can package shown in FIG. 4. The vertical axis represents output light intensity [mW], and the horizontal axis represents temperature [° C.].

As shown in the graph (a) in FIG. 5, the output of the light emitting element (VCSEL) decreases in conjunction with rise in temperature (the ambient temperature, the use temperature). Therefore, in accordance with the above, the output of the can package 100 shown in FIG. 4 also decreases in conjunction with rise in the temperature (the graph (b)). It should be noted that in this case the drive current of the light emitting element was kept constant. The graph (c) in FIG. 5 shows the ideal can package output.

Correspondingly, in the present embodiment, since the transmission efficiency of the diffraction grating 53 can be increased at higher temperature as described above, the decrease in the output of the light emitting element 10 caused by the rise in temperature can be canceled with the rise in the transmission efficiency of the diffraction grating 53.

Figure 6:
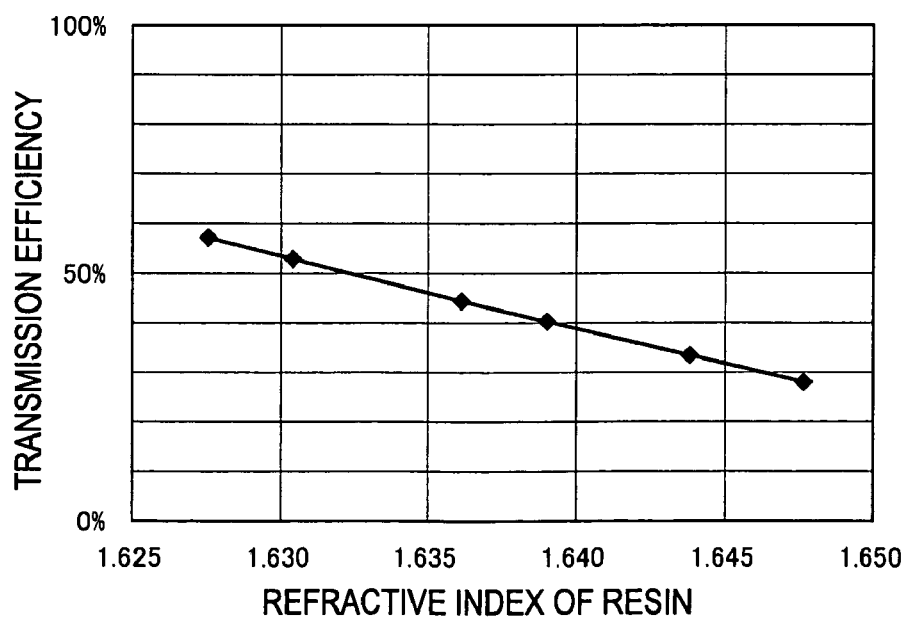
FIG. 6 is a diagram showing dependency of transmission efficiency of zero-order light of the diffraction grating 53 on a refractive index of resin.

FIG. 6 shows dependency of transmission efficiency of zero-order light of the diffraction grating 53 on a refractive index of resin. The vertical axis represents transmission efficiency [%], and the horizontal axis represents refractive index of resin. As shown in the drawing, the transmission efficiency (diffraction efficiency, transmittance) increases as the refractive index of the PEI resin decreases. It should be noted that a simulation using Fourier conversion was performed here, arranging that the output value (the coupling light intensity in the coupling section, the target output value) at 25° C. was 0.72 mW, the drive current of the light emitting element 10 was 5 mA, and the output of the light emitting element was 1.81 mW. Further, in order that the transmission efficiency of the zero-order light on this occasion might be about 40%, it was arranged that the depth of the diffraction grating (the concave sections) was 4.05 μm and the diffraction pitch (the interval between the concave sections) was 8 mμ. It should be noted that the arrangement (design) of the diffraction grating 53 is not limited to the values described above, but can appropriately be set in accordance with the characteristics of the light source, an amount of attenuation, and the temperature coefficient to be provided.

Figure 7:
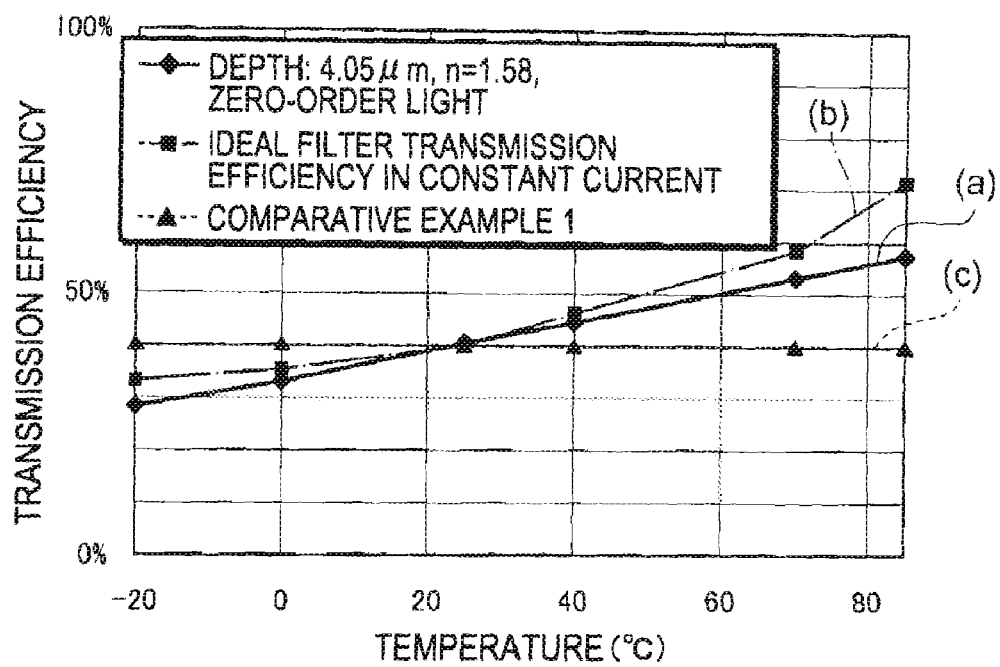
FIG. 7 is a diagram showing a temperature characteristic of the transmission efficiency of the diffraction grating.

FIG. 7 shows the temperature characteristic of the transmission efficiency of the diffraction grating. The vertical axis represents transmission efficiency [%], and the horizontal axis represents temperature [° C.]. The graph (a), the graph (b), and the graph (c) show the transmission efficiency of the zero-order light of the diffraction grating 53, the transmission efficiency of an ideal filter, and the transmission efficiency of the glass plate 22 of the optical module (the comparative example 1) shown in FIG. 4, respectively. According to the filter shown in the graph (b), the ideal can package 100 output shown in the graph (c) in FIG. 5 can be achieved. As shown in the drawing, in the optical module of the present embodiment, the transmission efficiency can be raised in conjunction with rise in the temperature. Further, in comparison with the comparative example 1 (FIG. 4), the transmission efficiency was successfully made closer to the transmission efficiency of the ideal filter.

Figure 8:
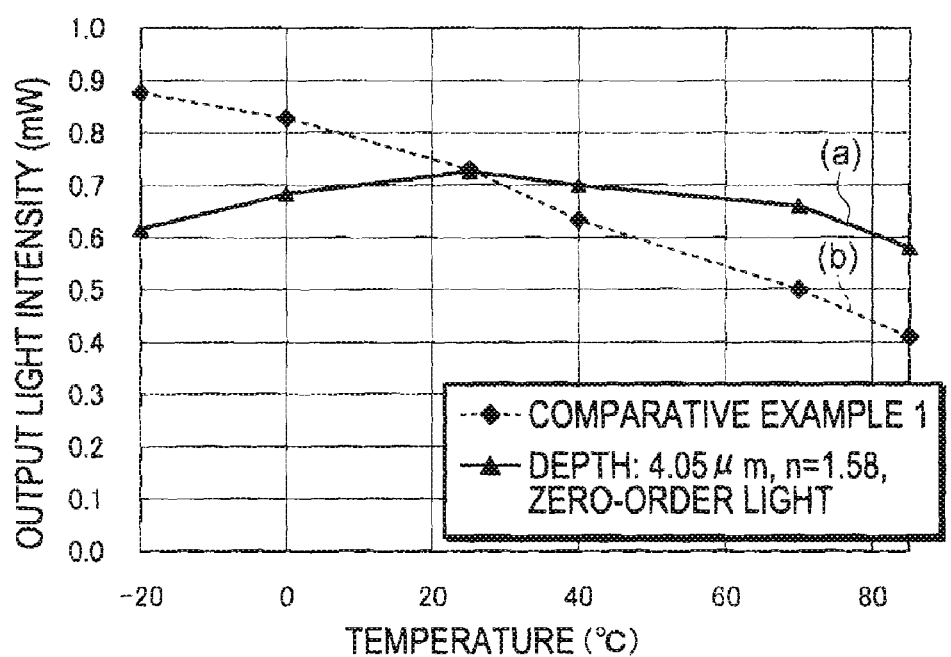
FIG. 8 is a diagram showing a temperature characteristic of the output light intensity of a light emitting element 10.

FIG. 8 shows a temperature characteristic (the graph (a)) of the output light intensity (the coupling light intensity in the coupling section) of the light emitting element 10. The vertical axis represents output light intensity [mW], and the horizontal axis represents temperature [° C.]. It should be noted that the drive current of the light emitting element 10 was kept constant. The graph (b) shows the case with the comparative example 1 (the optical module shown in FIG. 4). As shown in the drawing, the temperature-dependent variation in the output light intensity (the transmitted light through the diffraction grating 53) of the light emitting element 10 was reduced successfully.

As explained in detail hereinabove, according to the present embodiment, since the diffraction grating 53 is disposed on the light path of the light emitting element 10, the variation in the output of the can package 100 can be suppressed. In other words, the coupling efficiency can be raised in conjunction with rise in the temperature. Thus, the characteristics of the optical module can be improved.

Figures 9, 10:
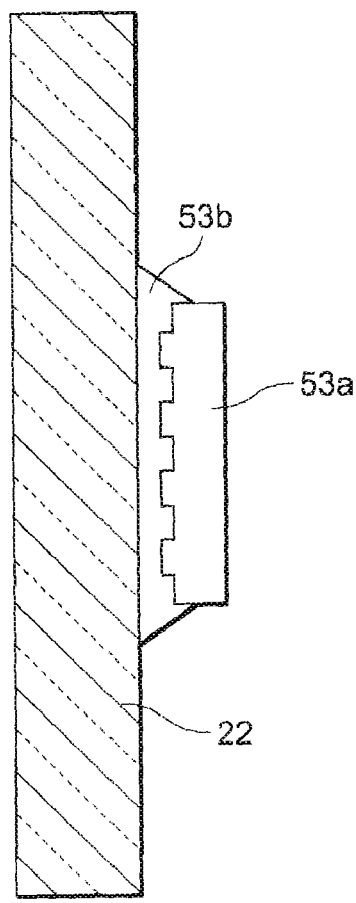
FIG. 9 is a diagram showing a temperature coefficient of the refractive index of resin.
FIG. 10 is a partial cross-sectional view showing a diffraction grating section of another optical module according to the first embodiment of the invention.

It should be noted that although the PEI resin is used as the resin for forming the diffraction grating 53 in the present embodiment, other resin having a property of decreasing the refractive index thereof in conjunction with rise in temperature can also be used. As such a material, besides the PEI resin, polymethylmethacrylate (PMMA), polycarbonate (PC), polystyrene (PS), and so on can be cited. FIG. 9 shows the temperature coefficient of the refractive index of each of these resins.

Further, although in the present embodiment, the diffraction grating 53 is formed with glass (the first layer) and resin (the second layer) and bonded with the glass plate 29, it is also possible to bond the glass 53a therewith using adhesive resin 53b having a property of decreasing the refractive index thereof in conjunction with rise in the temperature as shown in FIG. 10. FIG. 10 is a partial cross-sectional view showing a diffraction grating section of another optical module according to the present embodiment of the invention.

As shown in the drawing, the glass (the first layer) 53a provided with the concave sections (the gray pattern in FIG. 3) by the patterning process described above is bonded with the glass plate 22 of the can package 100 using the resin 53b. For example, the adhesive resin with the property of decreasing the refractive index thereof in conjunction with rise in the temperature is applied on the process surface of the glass to be bonded on the glass plate 22. As the adhesiveness, UV (ultraviolet) curing property, thermosetting property, and so on can be cited. Specifically, after bringing the resin into contact therewith, adhesive bonding is achieved by curing the resin with exposure to UV radiation or a thermal treatment.

It should be noted that the resin used for the embodiment described above is not limited to those shown in FIG. 9. Further, not only a single component but also a mixture of any of these materials or addition of adhesive resin can be adopted, thus achieving various adjustments.

Second Embodiment

In the present embodiment, a monitoring light receiving element (a light intensity monitor) 20 is provided to perform feedback control (APC) of the drive current of the light emitting element. It should be noted that the same sections as in the first embodiment are denoted with the same reference numerals, and detailed explanations therefor will be omitted.

Figure 11:
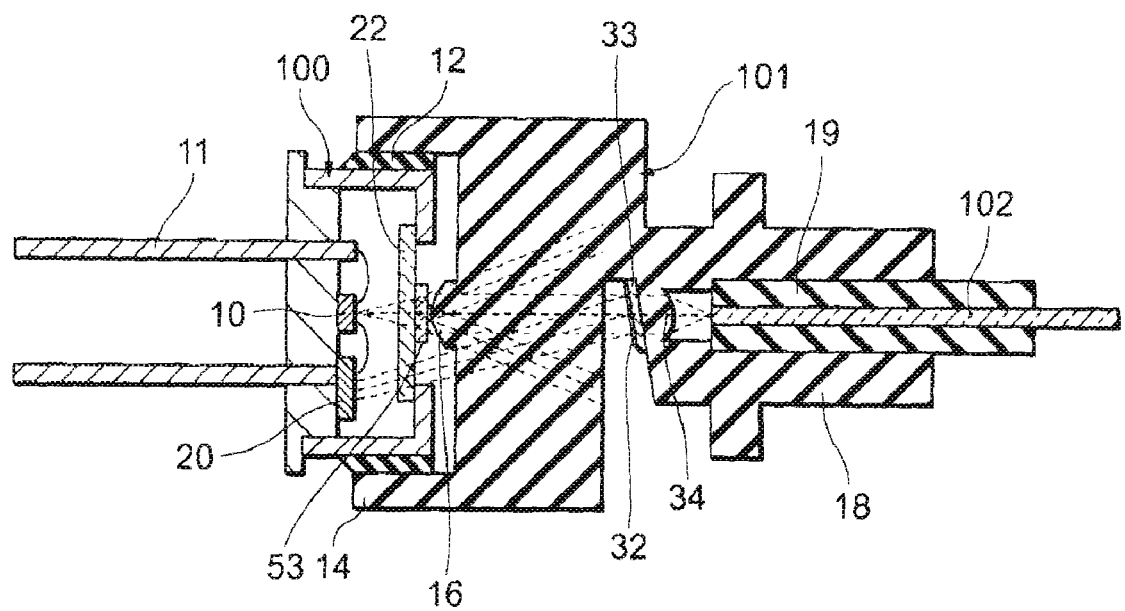
FIG. 11 is a cross-sectional view showing a configuration of an optical module according to a second embodiment of the invention.

FIG. 11 is a cross-sectional view showing a configuration of an optical module according to the present embodiment of the invention. Similarly to the case with the first embodiment, the optical module according to the present embodiment is composed of the can package 100 and the connector component 101.

In the present embodiment, the can package 100 is provided with the monitoring light receiving element 20 as a configuration for monitoring the optical output of the light emitting element 10. The monitoring light receiving element 20 is connected to the lead wire 11, and further to the light emitting element 10 via a wire.

Further, the connector component 101 is provided with a partial reflection film (a branching member, a partial reflection member) 32 and a lens (a second lens) 34. These sections are disposed on the light path of the output light of the light emitting element 10. In other words, these sections are disposed between the lens (the first lens) 16 and the optical fiber 102. The distance between the light emitting element 10 and the partial reflection film 32 is D2 which is greater than the distance D1 between the light emitting element 10 and the diffraction grating 53. Further, the partial reflection film 32 is disposed so that one of the surfaces thereof is disposed obliquely (not perpendicularly) on the light path of the output light of the light emitting element 10. The partial reflection film 32 is formed, for example, of an extremely thin dielectric film coated on a surface of a glass plate 33, and reflects a partial component (first light) of the output light of the light emitting element, quasi-collimated by the lens 16. About 10% of the output light is reflected, for example. It should be noted that the other component (second light) thereof is transmitted through the partial reflection film 32.

The partial reflection film 32 is desirably designed so that the transmission/reflection ratio does not vary in accordance with the wavelength of the incident light or the temperature. In other words, it is desirable to reflect a constant proportion of the incident light independently of the wavelength and the temperature.

Here, the partial reflection film (the glass plate 33) 32 is disposed on an oblique surface traversing the output light of the light emitting element 10. The oblique surface can be formed, for example, by cutting out a part of the resin member forming the connector component 101. It should be noted that it is also possible to directly coating the dielectric film on the oblique surface. Further, the configuration omitting the lens 34 can also be adopted.

Here in the present embodiment, the output light of the light emitting element 10 is reflected (branched) by the partial reflection film 32. The monitoring light receiving element 20 is disposed at a position where the reflected light (the branched light, the first light) caused by the partial reflection film 32 can be received. Further, the monitoring light receiving element 20 generates a current (hereinafter referred to as a "monitor current") corresponding to the received light intensity (the light intensity of the reflected light). The monitoring light receiving element 20 is formed, for example, of a semiconductor element such as a photodiode or a phototransistor. Therefore, since the received light intensity of the monitoring light receiving element 20 varies in accordance with the variation in the output light, the monitor current can be controlled. As described above, the light intensity of the output light from the light emitting element 10 can thus be controlled.

As described above, according to the present embodiment, since the diffraction grating 53 is disposed on the light path of the output light of the light emitting element 10, the temperature-dependent variation of the output light (the light transmitted through the diffraction grating 53) of the can package 100 can be reduced.

Further, by the feedback control (APC) with the monitoring light receiving element 20, the uniformity of the output light of the light emitting element 10 can further be improved. Further, even in the case in which the output light of the light emitting element 10 is varied by other factors than the variation in the temperature, the output light can be adjusted. Still further, even in the case in which the characteristic thereof is shifted from the design value because of the production tolerance of the diffraction grating 53 and so on, the output light can be adjusted.

Further, the use temperature range of the optical module can be widened. Hereinafter, the advantages will be explained. As explained in the first embodiment with reference to FIG. 5, the output of the light emitting element (VCSEL) 10 decreases in conjunction with rise in the temperature (the graph (a) in FIG. 5). Therefore, in accordance therewith, the output of the can package 100 also decreases (the graph (b) in FIG. 5). However, by performing the feedback control with the monitoring light receiving element 20, improvement of the uniformity of the output on the can package 100 can be achieved, thus the output can be made closer to the ideal can package output (the graph (c)).

However, the drive current (the monitor current) is provided with an upper limit value in order for preventing the optical output from becoming too large. Therefore, it is restricted to drive the light emitting element with the drive current exceeding the upper limit value. As a result, the use of the optical module at the temperature requiring the drive current exceeding the upper limit value is restricted. It should be noted that the upper limit value is appropriately set by the device.

In contrast, according to the present embodiment, since the temperature-dependent variation in the output light of the can package 100 is reduced by the diffraction grating 53, the small rate of the adjustment by the drive current (the monitor current) of the light emitting element 10 is allowed. In other words, there is no need for applying too large current.

Figure 12:
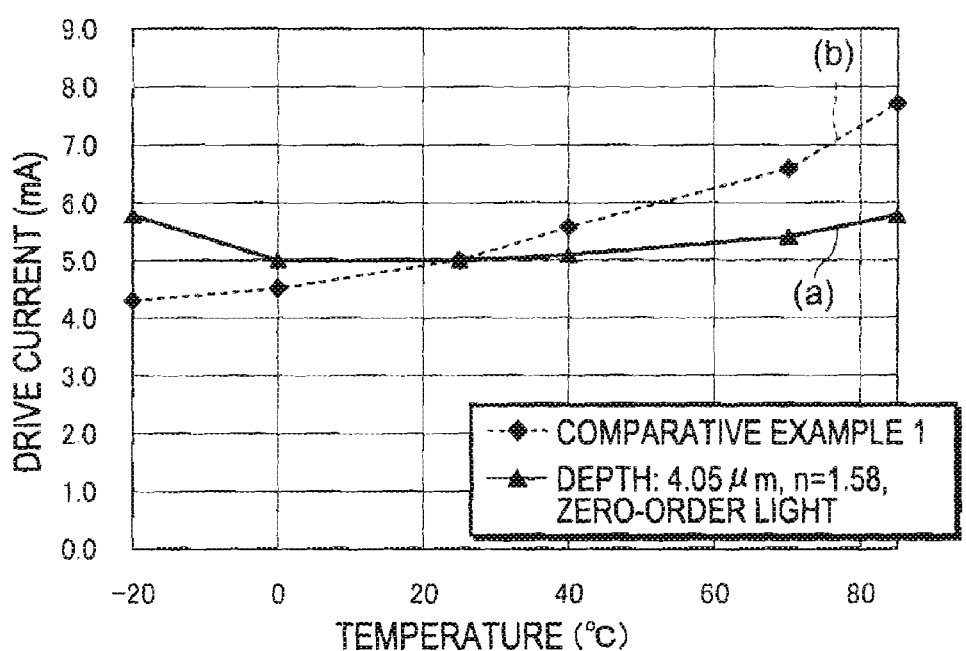
FIG. 12 is a diagram showing a temperature characteristic of a drive current of a light emitting element when APC drive is performed.

FIG. 12 shows the temperature characteristic of the drive current of the light emitting element when the APC drive is performed. The vertical axis represents drive current [mA], and the horizontal axis represents temperature [° C.]. It should be noted that the conditions of the simulation are the same as those in the first embodiment. The graph (a) corresponds to the present embodiment, and the graph (b) corresponds to the case (a comparative example 2) in which the diffraction grating 53 was not used. As shown in the drawing, in the graph (b), the drive current increases in conjunction with rise in the temperature. In contrast, in the graph (a), the rising width of the graph is small, and the rate of change in the drive current is small in comparison with the graph (b). Therefore, in addition to the advantages of the first embodiment, the use temperature range of the optical module can be widened.

Third Embodiment

Although in the embodiment described above, the grating pattern is arranged to have the stripe shape, the grating pattern can be arranged as a two-dimensional diffraction grating. It should be noted that the present embodiment is the same as the second embodiment except the grating pattern.

Figure 13:
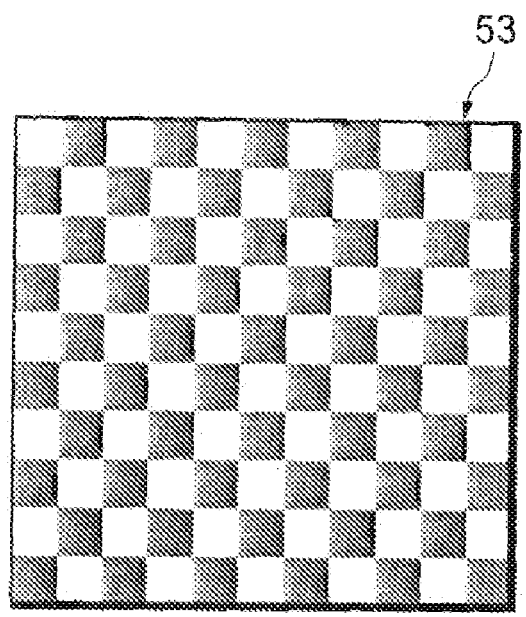
FIG. 13 is a diagram showing another example of a pattern of the diffraction grating.

FIG. 13 shows another example of the diffraction grating pattern. As shown in FIG. 13, the diffraction grating pattern can be a checkerboard pattern. It should be noted that the gray sections in the drawing correspond to concave sections. Such a diffraction grating 53 can also be formed by the manufacturing process described in the first embodiment.

For example, in the case in which a light emitting element with unstable polarization characteristic is used with the one-dimensional diffraction grating, the diffraction efficiency varies in accordance with the polarization state of the incident light, and consequently, a problem of unstable transmission efficiency arises.

In the case in which a checkerboard pattern is used as the pattern of the diffraction grating, anisotropy in the pattern can be eliminated, and consequently, the transmission efficiency of the diffraction grating is stabilized even in the case in which instability exists in the polarization of the output light of the light emitting element (the light source). In particular, in the case in which the light emitting element performs the multimode emission, the unstable polarization is apt to occur. Therefore, the present embodiment is preferably used for the optical module performing the multimode emission. As described above, according to the present embodiment, the transmission efficiency can be stabilized.

Further, when the checkerboard pattern is adopted, since the depth of the concave section for obtaining the same transmission efficiency of the zero-order light can be shallower in comparison with the case with the simple grating, the depth of the concave section can be reduced. Thus, the etching time is shortened to make the manufacture easier.

Then, the result of a simulation of the case of using the diffraction grating (checkerboard lattice) with the checkerboard pattern will be shown with reference to FIGS. 14 through 17. Based on these drawings, advantages of the present embodiment will be explained in further detail.

Firstly, as explained in the first embodiment, the output of the light emitting element 10 decreases in conjunction with rise in the temperature. Therefore, in accordance with the above, the output of the can package 100 also decreases in conjunction with rise in the temperature (see FIG. 5).

Figure 14:
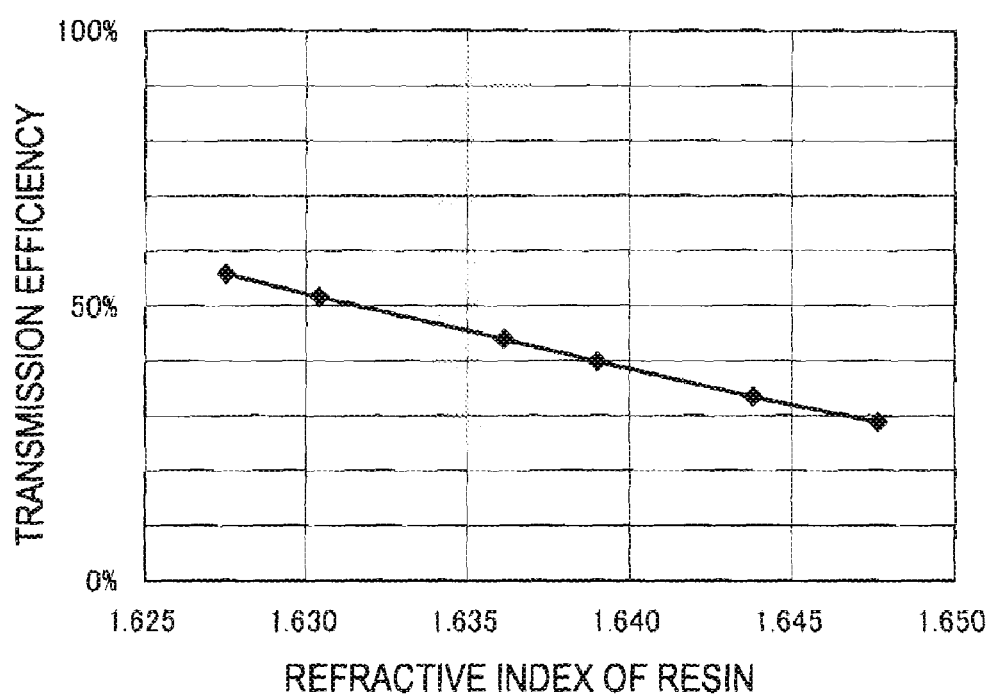
FIG. 14 is a diagram showing dependency of transmission efficiency of zero-order light of a checkerboard lattice on the refractive index of resin.

FIG. 14 shows dependency of transmission efficiency of zero-order light of the checkerboard lattice on a refractive index of resin. As shown in the drawing, the transmission efficiency increases as the refractive index of the PEI resin decreases. It should be noted that a simulation using Fourier conversion was performed here, arranging that the output value at 25° C. was 0.72 mW, the drive current of the light emitting element 10 was 5 mA, and the output of the light emitting element was 1.81 mW. Further, the depth of the diffraction grating (the concave sections) was set to 3 μm, and the refractive index of glass was set to 1.58. It should be noted that the arrangement (design) of the diffraction grating 53 is not limited to the values described above, but can appropriately be set in accordance with the characteristics of the light source, an amount of attenuation, and the temperature coefficient to be provided.

Figure 15:
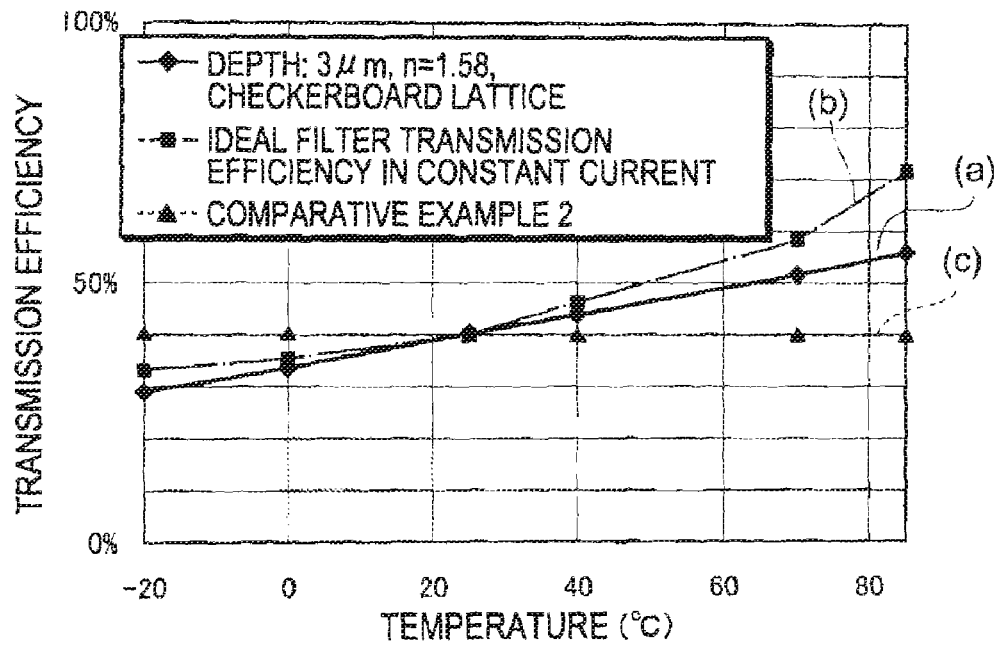
FIG. 15 is a diagram showing a temperature characteristic of the transmission efficiency of the checkerboard lattice.

FIG. 15 shows the temperature characteristic of the transmission efficiency of the checkerboard lattice. The graph (a), the graph (b), and the graph (c) show the transmission efficiency of the zero-order light of the diffraction grating 53, the transmission efficiency of an ideal filter, and the transmission efficiency of the glass plate 22 of the case (the comparative example 2) in which the diffraction grating 53 was not used, respectively. According to the filter shown in the graph (b), the ideal can package 100 output can be achieved. As shown in the drawing, in the optical module of the present embodiment, the transmission efficiency can be raised in conjunction with rise in the temperature. Further, in comparison with the comparative example 2, the transmission efficiency was successfully made closer to the transmission efficiency of the ideal filter.

Figure 16:
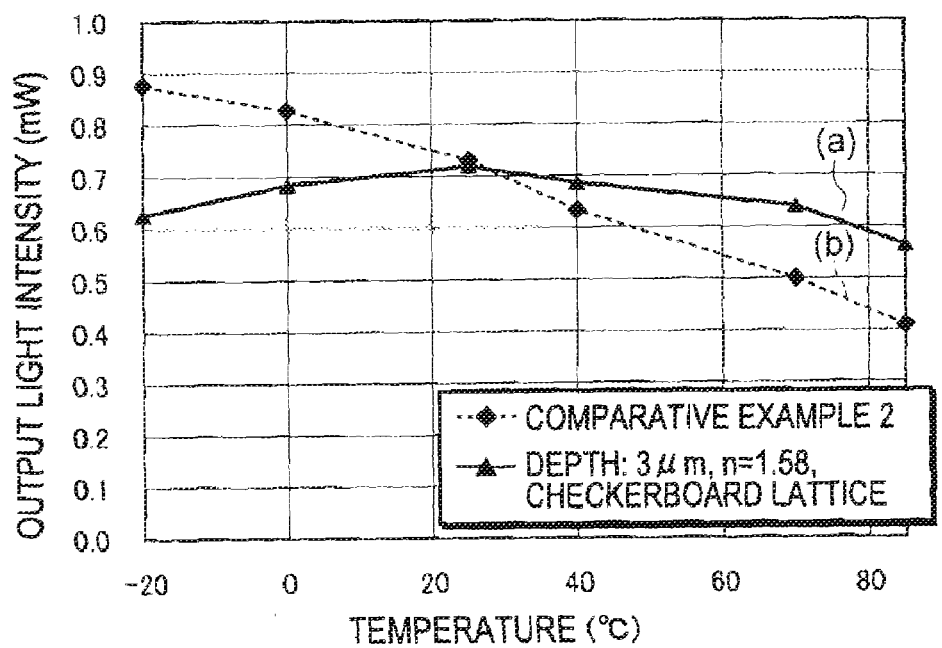
FIG. 16 is a diagram showing the temperature characteristic of the output light intensity of the light emitting element 10.

FIG. 16 shows a temperature characteristic (the graph (a)) of the output light intensity (the coupling light intensity in the coupling section) of the light emitting element 10. It should be noted that the drive current of the light emitting element 10 was kept constant. The graph (b) shows the case with the comparative example 2. As shown in the drawing, the temperature-dependent variation in the output light intensity (the transmitted light through the diffraction grating 53) of the light emitting element 10 was reduced successfully.

Figure 17:
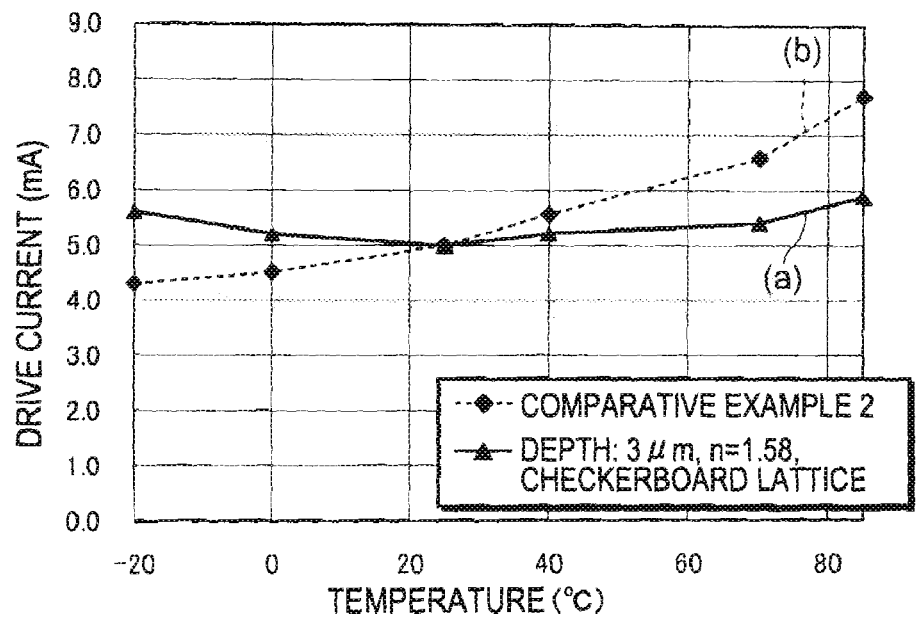
FIG. 17 is a diagram showing the temperature characteristic of the drive current of the light emitting element when the APC drive is performed.

FIG. 17 shows the temperature characteristic of the drive current of the light emitting element when the APC drive is performed. The graph (a) corresponds to the present embodiment, and the graph (b) corresponds to the comparative example 2. As shown in the drawing, in the graph (b), the drive current increases in conjunction with rise in the temperature. In contrast, in the graph (a), the rising width of the graph is small, and the rate of change in the drive current is small in comparison with the graph (b). Therefore, in addition to the advantages of the first embodiment, the use temperature range of the optical module can be widened.

It should be noted that it is possible to perform the same diffraction as in the checkerboard lattice by disposing two simple gratings in both vertical and horizontal directions.

Fourth Embodiment

Although in the embodiment described above, the zero-order light transmitted through the diffraction grating is coupled to the end of the optical fiber 102, the first-order light is coupled thereto in the present embodiment. It should be noted that the same sections as in the first through third embodiments are denoted with the same reference numerals, and detailed explanations therefor will be omitted.

Figure 18:
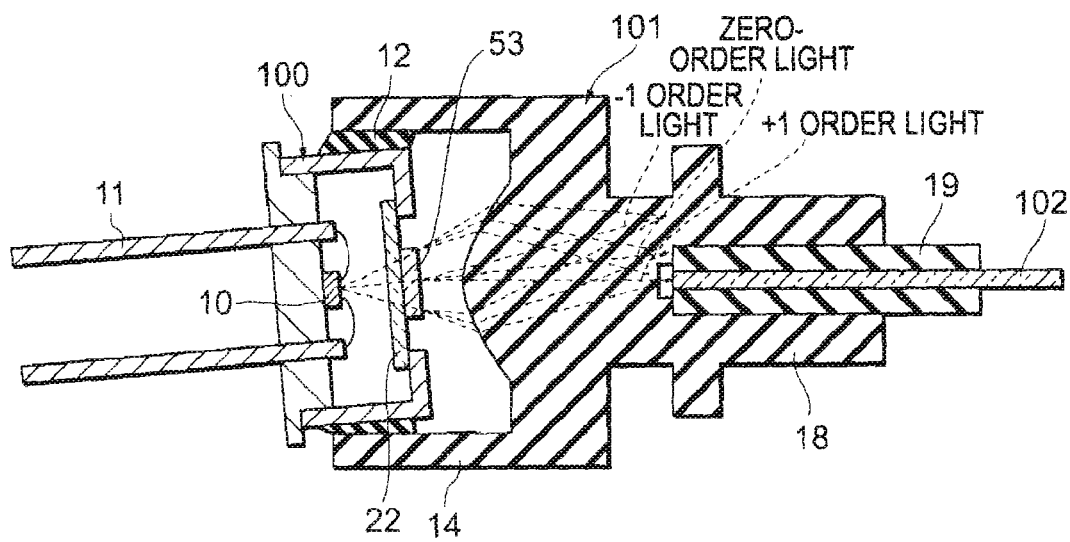
FIG. 18 is a cross-sectional view showing a configuration of an optical module according to a fourth embodiment of the invention.

FIG. 18 is a cross-sectional view showing a configuration of an optical module according to the present embodiment of the invention. Similarly to the case with the first embodiment, the optical module according to the present embodiment is composed of the can package 100 and the connector component 101. Further, similarly to the case with the first embodiment and so on, the diffraction grating (the simple grating) 53 is disposed on the reverse side (the surface on the opposite side to the light emitting element 10) of the glass plate 22. It should be noted that although no monitoring light receiving element is provided in FIG. 18, the glass plate 33, the partial reflection film 32, and the monitoring light receiving element 20 can be disposed similarly to the case with the second embodiment as the configuration for monitoring the optical output of the light emitting element 10 (see FIG. 11).

Here in the present embodiment, in order for coupling the first-order light to the optical fiber 102, the diffraction grating 53 is disposed so as to be oblique with respect to a plane perpendicular to the optical fiber 102 at an angle θ. The angle θ corresponds to an angle between the zero-order light and the first-order light (see FIG. 2). It should be noted that the present embodiment is the same as the first embodiment except that the diffraction grating is disposed obliquely.

Therefore, the first-order light (+1 order light in the drawing) is coupled to the end of the optical fiber 102. Therefore, by using the diffraction grating 53 explained in the first through third embodiments, the coupling efficiency of the first-order light can be raised, thus the decrease in the output light corresponding to the temperature can be compensated.

Subsequently, with reference to FIGS. 19 through 23, the simulation result in the case of coupling the first-order light via the diffraction grating 53 will be shown. Based on these drawings, advantages of the present embodiment will be explained in further detail.

Figure 19:
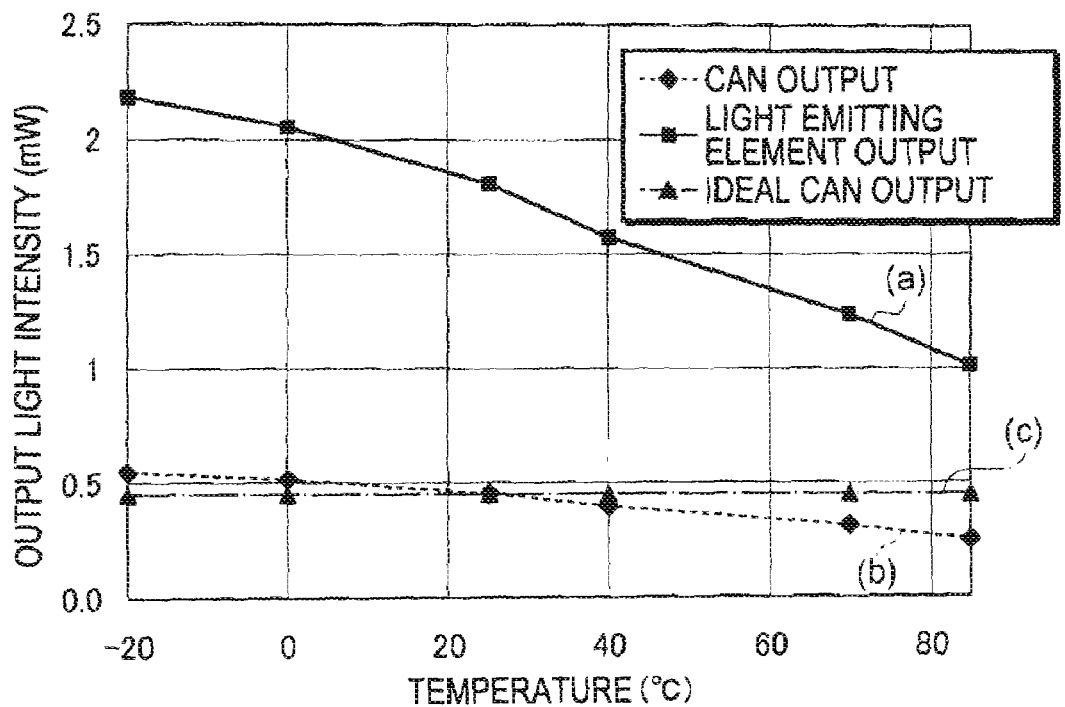
FIG. 19 is a diagram showing a temperature characteristic of the output light intensity of first-order light of the can package in the case (a comparative example 3) of not using the light emitting element and the diffraction grating 53.

FIG. 19 shows a temperature characteristic of the output light intensity of first-order light of the can package in the case (a comparative example 3) of not using the light emitting element and the diffraction grating 53. As shown in the graph (a) in FIG. 19, the output of the light emitting element (VCSEL) decreases in conjunction with rise in temperature (the ambient temperature, the use temperature). Therefore, in accordance with the above, the output (the first-order light) of the can package 100 also decreases in conjunction with rise in the temperature (the graph (b)). It should be noted that in this case the drive current of the light emitting element was kept constant. The graph (c) in FIG. 5 shows the output of the first-order light of the ideal can package. It should be noted that in FIG. 19 the output light intensity is lower in comparison with the output light intensity shown in FIG. 5. In other words, since the first-order light is branched into two components (+1 order light and −1 order light), the diffraction efficiency (the transmission efficiency) becomes around 20 through 30%, which is lower than that of the zero-order light. Therefore, the efficiency of the output light intensity of the light emitting element becomes lower than in the case of using the zero-order light. Consequently, in the case in which the larger attenuation than in the first embodiment is required, for example, the attenuation can be performed without using the partial reflection film. As described above, by using the first-order light, an amount of attenuation can be increased. Obviously, the partial reflection film can be used together therewith.

Figure 20:
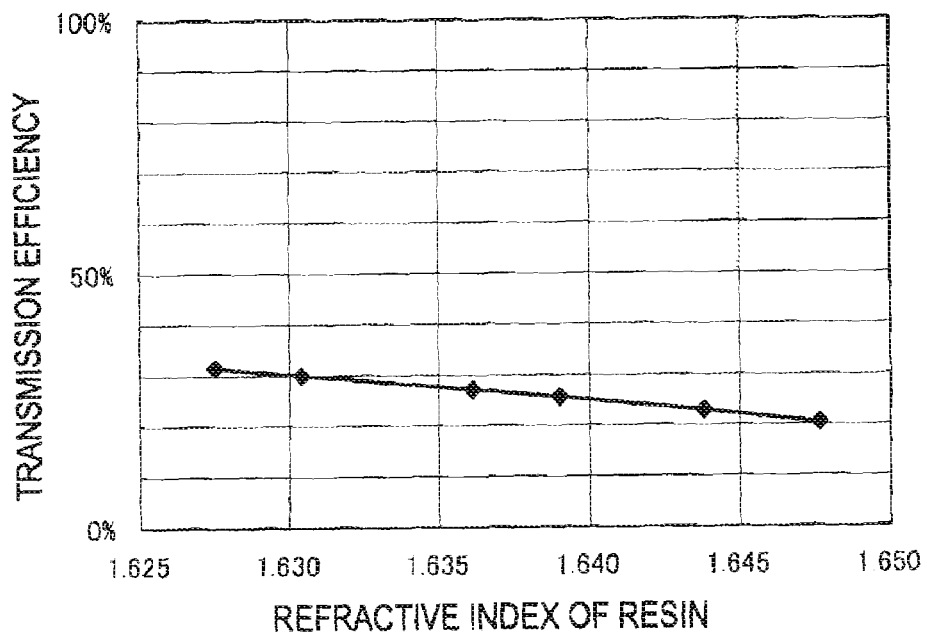
FIG. 20 is a diagram showing dependency of transmission efficiency of the first-order light on the refractive index of resin.

FIG. 20 shows dependency of transmission efficiency (diffraction efficiency) of the first-order light on a refractive index of resin. As shown in the drawing, the transmission efficiency increases as the refractive index of the PEI resin decreases.

As described above, the PEI resin has a characteristic that the refractive index thereof is lowered in conjunction with rise in the temperature. On the other hand, the refractive index of the glass used here at 25° C. is 1.7 with little (negligible small) temperature-dependent variation in the refractive index. Further, it is arranged here that the refractive index of the glass keeps larger than the refractive index of the resin in a use temperature range (e.g., −20° C. through 80° C.). For example, the refractive indexes at 25° C. are set as 1.7>1.64. Therefore, at the high temperature, the refractive index of the resin is lowered, thus increasing the difference in the refractive index. As described above, the diffraction efficiency becomes higher as the difference in the refractive index increases. In other words, when the difference in the refractive index is small, the proportion of the zero-order light is large, and as the difference in the refractive index becomes larger, the proportion of the first-order light increases (the proportion of the zero-order light decreases).

Therefore, as the refractive index of the PEI resin becomes lower, the diffraction efficiency of the first-order light becomes higher.

It should be noted that a simulation using Fourier conversion was performed here, arranging that the output value at 25° C. was 0.72 mW, the drive current of the light emitting element 10 was 5 mA, and the output of the light emitting element was 1.81 mW. Further, the depth of the diffraction grating (the concave sections) was set to 4.05 μm, and the refractive index of glass was set to 1.7. It should be noted that the arrangement (design) of the diffraction grating 53 is not limited to the values described above, but can appropriately be set in accordance with the characteristics of the light source, an amount of attenuation, and the temperature coefficient to be provided.

Figure 21:
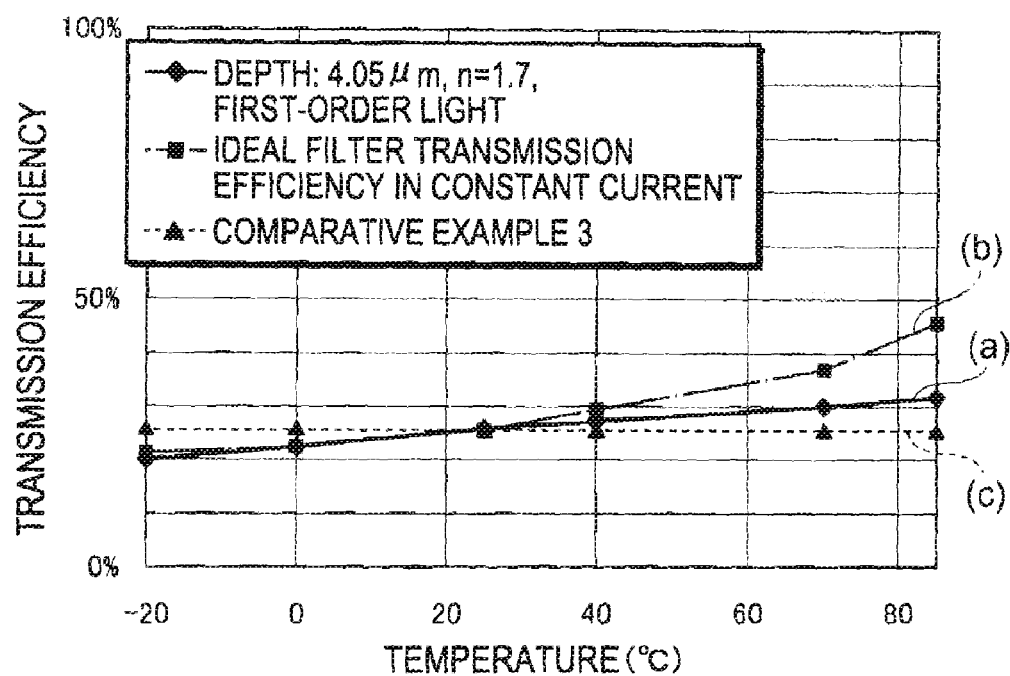
FIG. 21 is a diagram showing a temperature characteristic of the transmission efficiency of the first-order light of the diffraction grating.

FIG. 21 shows temperature characteristic of the diffraction efficiency (the transmission efficiency) of the first-order light of the diffraction grating. The graph (a), the graph (b), and the graph (c) show the diffraction efficiency of the first-order light of the diffraction grating 53, the transmission efficiency (the first-order light) of an ideal filter, and the diffraction efficiency of the glass plate 22 of the case (the comparative example 3) in which the diffraction grating 53 was not used, respectively. According to the filter shown in the graph (b), the ideal can package 100 output can be achieved. As shown in the drawing, in the optical module of the present embodiment, the diffraction efficiency can be raised in conjunction with rise in the temperature. Further, in comparison with the comparative example 3, the diffraction efficiency was successfully made closer to the transmission efficiency of the ideal filter.

Figure 22:
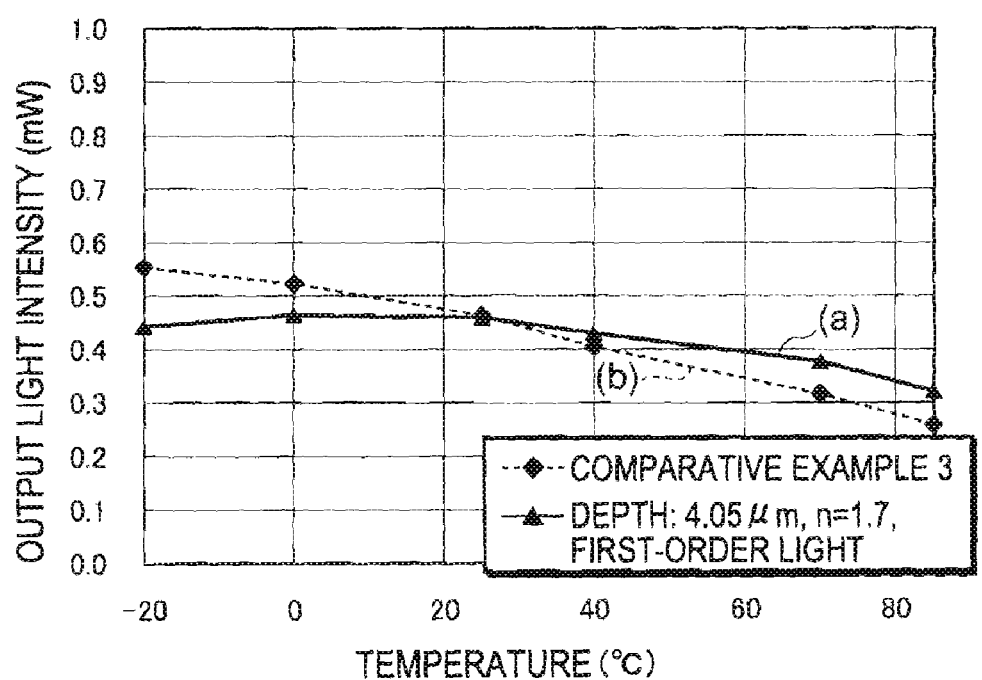
FIG. 22 is a diagram showing the temperature characteristic of the output light intensity of the light emitting element 10.

FIG. 22 shows a temperature characteristic (the graph (a)) of the output light intensity (the coupling light intensity in the coupling section) of the light emitting element 10. It should be noted that the drive current of the light emitting element 10 was kept constant. The graph (b) shows the case with the comparative example 3. As shown in the drawing, the temperature-dependent variation in the output light intensity (the transmitted light through the diffraction grating 53) of the light emitting element 10 was reduced successfully.

Figure 23:
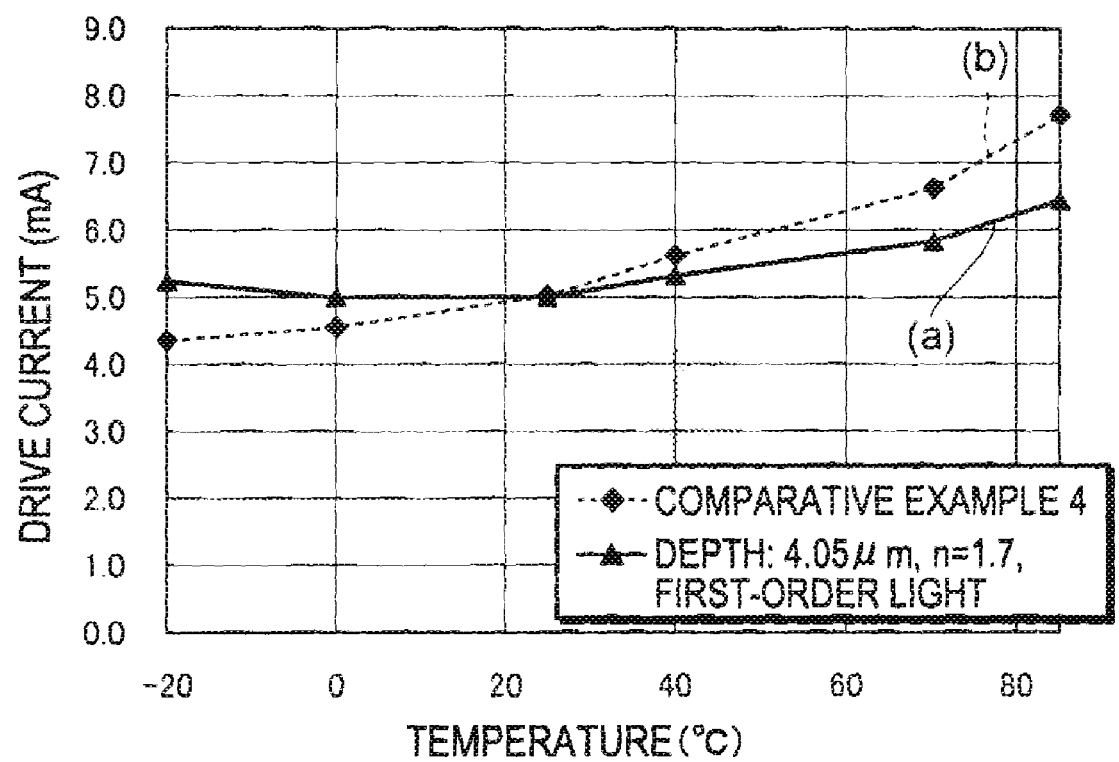
FIG. 23 is a diagram showing the temperature characteristic of the drive current of the light emitting element when the APC drive is performed.

FIG. 23 shows the temperature characteristic of the drive current of the light emitting element when the APC drive is performed. Specifically, the optical module shown in FIG. 18 is provided with the glass plate 33, the partial reflection film 32, and the monitoring light receiving element 20, and the APC drive is performed.

The graph (a) corresponds to the present embodiment, and the graph (b) corresponds to the case (a comparative example 4) in which the diffraction grating 53 was not used. As shown in the drawing, in the graph (b), the drive current increases in conjunction with rise in the temperature. In contrast, in the graph (a), the rising width of the graph is small, and the rate of change in the drive current is small in comparison with the graph (b). Therefore, in addition to the advantages of the first embodiment, the use temperature range of the optical module can be widened.

It should be noted that although in the present embodiment, the explanation is made exemplifying the simple grating, the checkerboard lattice can also be used.

As explained in detail hereinabove, according to the first through fourth embodiment described above, the variation in the output light of the light emitting element corresponding to the temperature can be reduced.

It should be noted that the optical modules of the first through fourth embodiments described above can be applied to an optical communication device. By using the optical modules described above, the optical communication device with reduced variation in the output light of the light emitting element corresponding to the temperature can be obtained. Further, the optical communication device with a wide use temperature range can be obtained. As described above, the device performance can be improved.

Further, although in the first through fourth embodiments, the VCSEL is cited as an example of the light emitting element, the light emitting element according to the invention is not limited to this device. Further, although in the embodiments described above, the explanations are presented exemplifying the can package, other package configurations (materials) such as ceramic sealing can also be used therefor. Further, the same applies to the composing material of the connector component.

Further, although in the first through fourth embodiments, the diffraction grating is provided to the glass plate of the can package, this is not a limitation, but the diffraction grating can be disposed anywhere on the light path of the output light from the light source.

Further, although in the first through fourth embodiments described above, the rectangular shape is exemplified as the grating pattern of the one-dimensional diffraction grating, and the checkerboard pattern is exemplified as the grating pattern of the two-dimensional diffraction grating, such patterns are not limitations. For example, a triangular shape, a saw-tooth shape, a sinusoidal shape, and so on can also be used as the grating pattern of the one-dimensional diffraction grating. Further, although in the first through fourth embodiments, the diffraction grating is composed of two layers, this configuration is not a limitation, but any diffraction grating provided with the characteristics required in the respective embodiments can be adopted. For example, the diffraction grating can be composed of three or more layers. Further, a hologram or the like can also be used. Further, the shape of the concave section of the diffraction grating can also be modified arbitrarily.

Further, although in the first through fourth embodiments, the output of the ideal can package 100 is determined so that the drive current becomes constant, the condition for making the drive current constant is not necessarily regarded as ideal (the target). For example, in high speed use, the operation speed is lowered in high-temperature and low-temperature areas. Therefore, it is also possible to arrange that the drive current (the monitor current) increases in the high-temperature and low-temperature areas. As described above, since there is a current value with which the emission is performed with the best efficiency for every temperature, if driving with such current values is possible, the transmission performance can further be improved.

As described above, the present invention is not limited to the content of the embodiments described above, but can be put into practice with various modification within the scope or the spirit of the present invention. For example, the specific examples explained in the above embodiments citing specific numeral values are nothing more than exemplifications, and do not limit the application range of the present invention. Further, the various configurations explained through the embodiments can arbitrarily be used in combination, or with modifications or improvements in accordance with the purposes.

What is claimed is:

1. An optical module comprising:
a light source;
a variable transmittance member disposed on a light path of output light from the light source distant from the light source; and
a coupling section for coupling the output light from the light source via the variable transmittance member,
wherein coupling efficiency as a ratio between intensity of the light from the light source and intensity of light to be coupled to the coupling section rises in conjunction with a rise in temperature, and
wherein the variable transmittance member is a diffraction grating having transmission efficiency varying in accordance with temperature.

2. The optical module according to claim 1, wherein the variable transmittance member has transmittance rising in conjunction with rise in temperature.

3. The optical module according to claim 1, wherein the light source is a vertical cavity surface emitting laser.

4. The optical module according to claim 1, wherein the diffraction grating includes two members with temperature-dependent variations in refractive index different from each other.

5. The optical module according to claim 4, wherein the diffraction grating includes
an organic material with refractive index lowered in conjunction with a rise in temperature, and
an inorganic material.

6. The optical module according to claim 5, wherein the diffraction grating includes
a first layer made of glass and provided with a convexo-concave pattern on one surface of the first layer, and
a second layer made of the organic material formed on the convexo-concave pattern.

7. The optical module according to claim 5, wherein the diffraction grating includes
a first layer made of glass and provided with a convexo-concave pattern on a first surface of the first layer, and
a second layer made of the organic material and for bonding the first surface to a transmitting member positioned on the light path.

8. The optical module according to claim 4, wherein the diffraction grating includes
an organic material with refractive index lowered in conjunction with a rise in temperature, and
an inorganic material, the organic material having higher refractive index than the inorganic material, and
zero-order light of the diffraction grating is coupled in the coupling section.

9. The optical module according to claim 4, wherein the diffraction grating includes
an organic material with refractive index lowered in conjunction with rise in temperature, and
an inorganic material, the organic material having lower refractive index than the inorganic material, and
first-order light of the diffraction grating is coupled in the coupling section.

10. The optical module according to claim 1, wherein the diffraction grating is a one-dimensional diffraction grating.

11. The optical module according to claim 1, wherein the diffraction grating is a two-dimensional diffraction grating.

12. The optical module according to claim 11, wherein a pattern of the diffraction grating is a checkerboard pattern.

13. The optical module according to claim 1,
the variable transmittance member being disposed a first distance distant from the light source, and the optical module further comprising:

a partial reflection member disposed on the light path a second distance greater than the first distance distant from the light source, and for reflecting a first light out of light transmitted through the variable transmittance member and transmitting a second light out of the transmitted light; and a light intensity monitor disposed on a light path of the first light, wherein the light intensity monitor detects light intensity of the first light transmitted through the variable transmittance member.

14. An optical communication device comprising the optical module according to claim 1.

* * * * *